United States Patent
Nojima

(10) Patent No.: US 8,486,808 B2
(45) Date of Patent: Jul. 16, 2013

(54) MANUFACTURING METHOD OF SEMICONDUCTOR DEVICE HAVING VERTICAL TRANSISTOR

(75) Inventor: Kazuhiro Nojima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 113 days.

(21) Appl. No.: 13/064,843

(22) Filed: Apr. 20, 2011

(65) Prior Publication Data

US 2011/0263099 A1 Oct. 27, 2011

(30) Foreign Application Priority Data

Apr. 27, 2010 (JP) ................................. 2010-102213

(51) Int. Cl.
*H01L 21/20* (2006.01)
(52) U.S. Cl.
USPC ........... 438/478; 438/270; 438/274; 438/586; 257/E21.09
(58) Field of Classification Search
USPC ......................................... 438/270, 274, 478
See application file for complete search history.

(56) References Cited

U.S. PATENT DOCUMENTS

| 7,872,301 | B2 | 1/2011 | Takaishi |
| 7,935,598 | B2 * | 5/2011 | Lee ............................... 438/268 |
| 2006/0097304 | A1 * | 5/2006 | Yoon et al. ..................... 257/307 |
| 2009/0170302 | A1 * | 7/2009 | Shin et al. ..................... 438/589 |
| 2010/0096691 | A1 * | 4/2010 | Shin et al. ..................... 257/329 |

FOREIGN PATENT DOCUMENTS

JP 2008-288391 11/2008

* cited by examiner

*Primary Examiner* — Angel Roman
(74) *Attorney, Agent, or Firm* — McGinn IP Law Group, PLLC

(57) ABSTRACT

A method of manufacturing a semiconductor device includes forming a gate electrode material that covers a gate insulating film formed on each of side surfaces of first and second silicon pillars, wherein a film formation amount of the gate electrode material is controlled so that a first part with which the side surface of the first silicon pillar is covered via the gate insulating film does not contact with a second part with which the side surface of the second silicon pillar is covered via the gate insulating film. The method further includes: forming a mask insulating film that covers the first and second parts and fills a region between the first and second parts; and etching the gate electrode material using the mask insulating film as a mask, thereby forming gate electrodes with which the side surfaces of the first and second silicon pillars are covered via the gate insulating film, respectively and a conductive film electrically connecting the gate electrodes to each other.

11 Claims, 12 Drawing Sheets

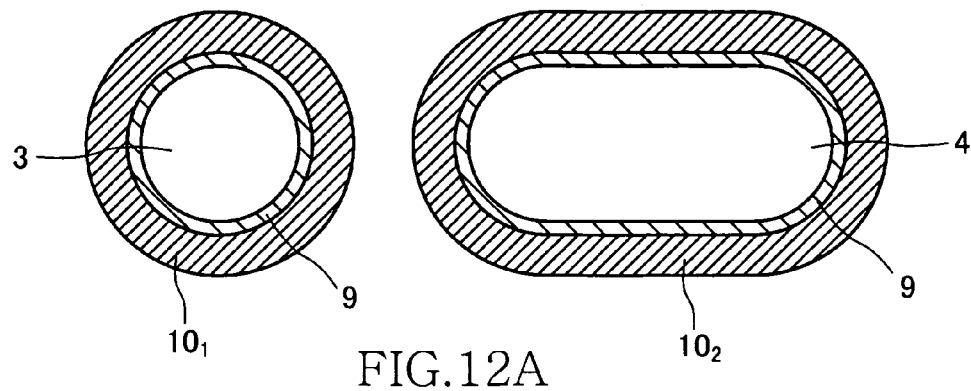
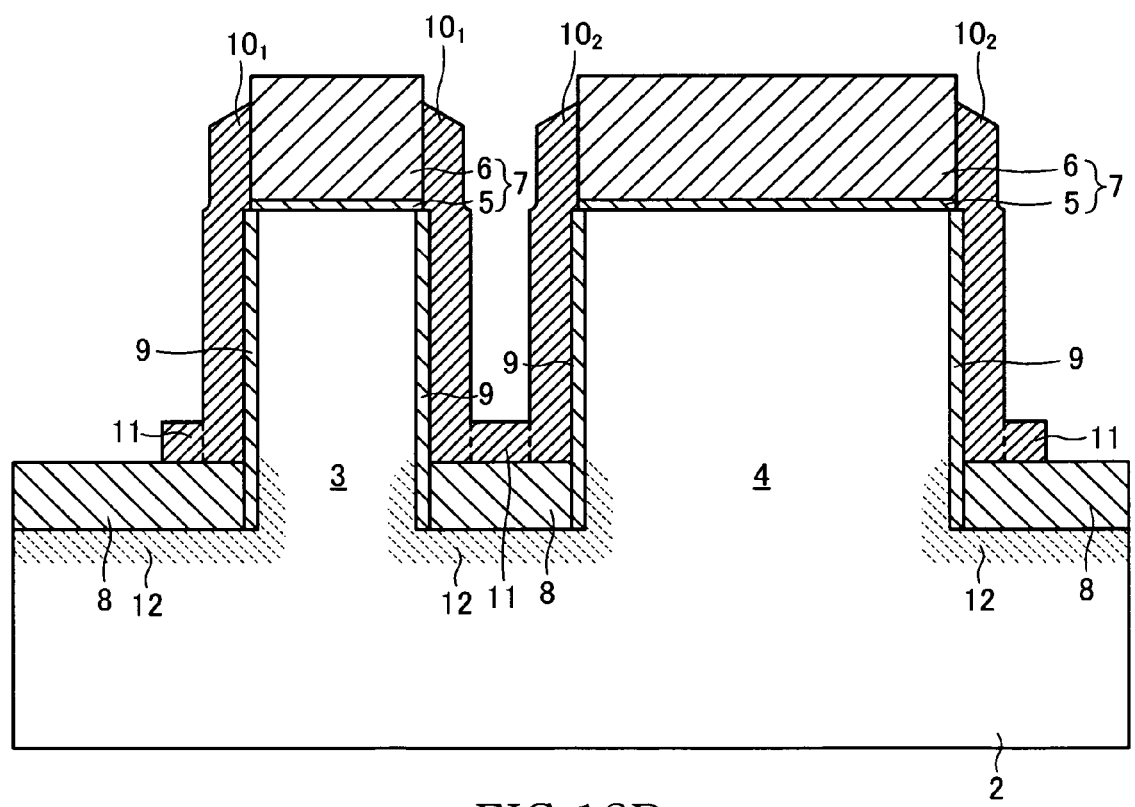
FIG.12A
FIG.12B

MANUFACTURING METHOD OF SEMICONDUCTOR DEVICE HAVING VERTICAL TRANSISTOR

BACKGROUND OF THE INVENTION

1. Field of the Invention

The present invention relates to a manufacturing method of a semiconductor device, and more particularly relates to a manufacturing method of a semiconductor device having a vertical transistor.

2. Description of the Related Art

Semiconductors, particularly memory devices have been reduced in chip size over the years for cost reductions. Accordingly, vertical transistors having a $4F^2$ structure (where F denotes a minimum feature size) have been adopted as cell transistors of a DRAM (Dynamic Random Access Memory). Conventional planar transistors are adopted as transistors of peripheral circuits as before because demand on peripheral circuits for size reduction is not so strong as compared with that on cell transistors. However, when cells and the peripheral circuits differ in a transistor structure, the number of processing steps greatly increases. Therefore, under these circumstances, it is recently considered to adopt vertical transistors as the transistors of the peripheral circuits (see Japanese Patent Application Laid-Open No. 2008-288391).

As described in the Japanese Patent Application Laid-Open No. 2008-288391, two proximate silicon pillars are employed in vertical transistors disposed in the peripheral circuits. One of the silicon pillars is used as a channel, impurity diffusion layers are provided in upper and lower portions of the silicon pillar, respectively, and a side surface thereof is covered with a gate electrode via a gate insulating film. The other silicon pillar is used as a dummy silicon pillar for laterally extending a length of the gate electrode and a gate contact plug is provided using an extension part.

The gate electrode is formed by forming a gate insulating film on the side surface of each of the silicon pillar and the dummy silicon pillar, then depositing a polycrystalline silicon film on an entire surface of a substrate by CVD (Chemical Vapor Deposition) method, and further performing etching-back. The film thickness of the gate electrode (a deposition amount of the polycrystalline silicon film) is set to be equal to or larger than half the length between the silicon pillar and the dummy silicon pillar. With this setting, the gate electrode formed on the silicon pillar is integrated with that formed on the dummy silicon pillar and then it is possible to control a channel within the silicon pillar via the gate contact plug.

SUMMARY

While polycrystalline silicon has been previously and generally used as a material of the gate electrode of a vertical transistor, a metal material such as tungsten or titanium nitride has been currently used more frequently. The reason for this is to suppress the influence of depletion in the gate electrode.

However, when the gate electrode is allowed to extend using the dummy silicon pillar as seen in the semiconductor device described in Japanese Patent Application Laid-Open No. 2008-288391 and the gate electrode is made of a metal material, warping deformation tends to occur to a silicon pillar. The warping deformation is described below in detail.

The gate electrode is subjected to heat treatment right after its formation. This is intended to relax a shrinkage intrinsic stress; however, when the gate electrode is made of a metal material, the gate electrode greatly shrinks at the time of the heat treatment, and a high compression thermal stress is generated in the silicon pillar. This is because the metal material is higher in thermal expansion coefficient than polycrystalline silicon or the like.

When the gate electrode extends using the dummy silicon pillar, the structure of the gate electrode is asymmetrical with respect to a central axis of the silicon pillar, and shrinkage of the gate electrode has a non-uniform effect on the silicon pillar. Therefore, the thermal stresses generated in the silicon pillar are non-uniform, resulting in occurrence of warping deformation to the silicon pillar.

It is thought that the thermal stresses generated in the silicon pillar can be reduced to some extent when the gate electrode is formed thin. However, as described above, there is a restriction on the film thickness of the gate electrode that the film thickness thereof is equal to or larger than half the length between the silicon pillar and the dummy pillar. Therefore, there is a limit to making the gate electrode thinner.

In one embodiment, there is provided a method of manufacturing a semiconductor device comprising: forming first and second silicon pillars on a surface of a semiconductor substrate; forming a gate insulating film on each of side surfaces of the first and second silicon pillars; and forming a gate electrode material that covers the gate electrode material, wherein a film formation amount of the gate electrode material is controlled so that a first part with which the side surface of the first silicon pillar is covered via the gate insulating film does not contact with a second part with which the side surface of the second silicon pillar is covered via the gate insulating film, and the method further comprises: forming a mask insulating film that covers the first and second parts and fills a region between the first and second parts; and etching the gate electrode material using the mask insulating film as a mask, thereby forming a first gate electrode with which the side surface of the first silicon pillar is covered via the gate insulating film, a second gate electrode with which the side surface of the second silicon pillar is covered via the gate insulating film, and a conductive film electrically connecting the first gate electrode to the second gate electrode.

According to the present invention, compression thermal stresses generated in the first and second silicon pillars are made uniform because of no direct contact between the first and second gate electrodes. This can suppress occurrence of warping deformation to the first and second silicon pillars. Further, because the conductive film is provided, it is possible to control a channel formed within the first silicon pillar via a gate contact plug in contact with the second gate electrode even when the first gate electrode is in no direct contact with the second gate electrode.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Before explaining embodiments of the present invention, a semiconductor device according to the background technique of the present invention and its problems are explained with reference to the accompanying drawings.

Figure 1A:
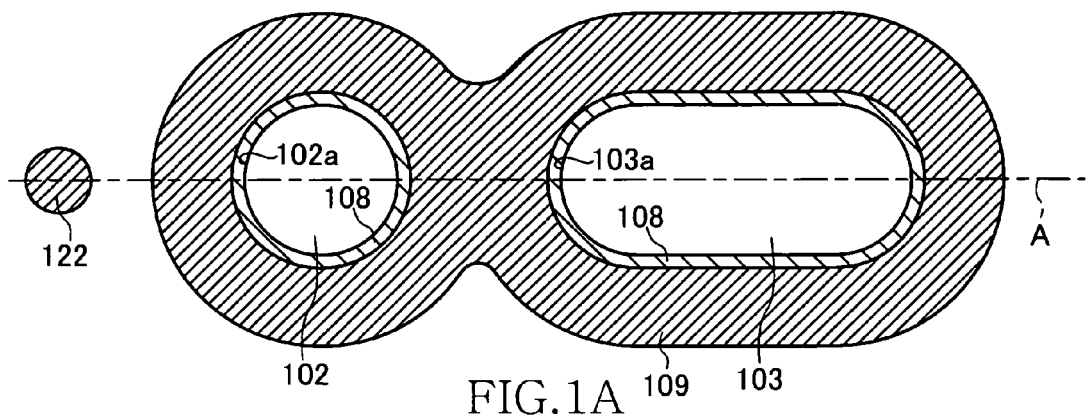
FIG. 1A is a schematic plan view which shows a structure of a semiconductor device according to the background technique of the present invention and shows a cross-section corresponding to a segment B shown in FIG. 1B.
Figure 1B:
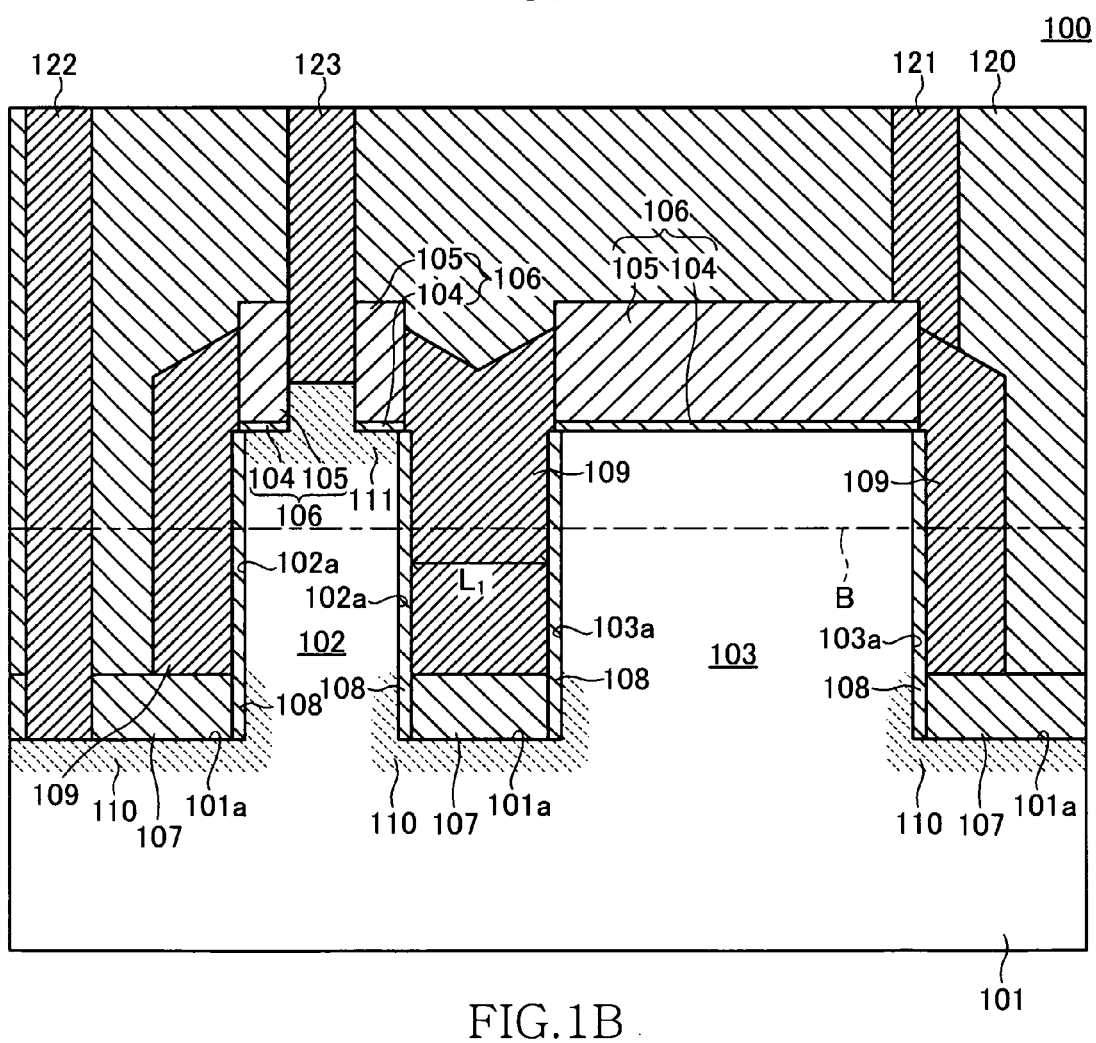
FIG. 1B is a schematic cross-sectional view which shows a structure of a semiconductor device according to the background technique of the present invention and shows a cross-section corresponding to a segment A shown in FIG. 1A.

FIGS. 1A and 1B show a structure of a semiconductor device 100 according to the background technique of the present invention, where FIG. 1A is a schematic plan view and FIG. 1B is a schematic cross-sectional view showing a cross-section corresponding to a segment A shown in FIG. 1A, and FIG. 1A shows a cross-section corresponding to a segment B shown in FIG. 1B.

As shown in FIGS. 1A and 1B, the semiconductor device 100 according to the background technique of the present invention includes two silicon pillars (a silicon pillar 102 and a dummy silicon pillar 103) formed by removing a part of a semiconductor (silicon) substrate 101. In the following description, "bottom surface 101a of the substrate 101" refers to a surface of the substrate 101 in contact with lower surfaces of the silicon pillars 102 and 103. The silicon pillars 102 and 103 are provided to be built on the bottom surface 101a of the substrate 101.

A cap insulating film 106 configured to include a silicon oxide film 104 and a silicon nitride film 105 is formed on each of upper surfaces of the silicon pillars 102 and 103. A silicon oxide film 107 is formed on the bottom surface 101a of the substrate 101.

A gate insulating film 108 is formed on each of a side surface 102a of the silicon pillar 102 and aside surface 103a of the dummy silicon pillar 103. Furthermore, a gate electrode 109 is formed outside of the gate insulating film 108. As shown in FIG. 1B, the gate electrodes 109 are structured to integrate a portion formed on the side surface 102 with a portion formed on the side surface 103a. This integrated structure is realized by setting a thickness (horizontal thickness) of each gate electrode 109 to be equal to or larger than half of a minimum length $L_1$ between the silicon pillars 102 and 103 (minimum length between surfaces of the gate insulating films 108).

An impurity diffusion layer 110 is provided inside of the bottom surface 101a (a part in contact with lower ends of the silicon pillars 102 and 103) of the substrate 101, and an impurity diffusion layer 111 is provided on an upper end of the silicon pillar 102.

The semiconductor device 100 also includes an interlayer insulating film 120 constituted by a silicon oxide film with which the constituent elements described above are covered. Three through-hole conductors 121 to 123 are formed in the interlayer insulating film 120. A lower portion of the through-hole conductor 121 contacts with an upper surface of the gate electrode 109, a lower portion of the through-hole conductor 122 contacts with an upper surface of the impurity diffusion layer 110, and a lower portion of the through-hole conductor 123 contacts with an upper surface of the impurity diffusion layer 111. The through-hole conductor 121 contacts with a part of a portion of the upper surface of the gate electrode 109 located on a peripheral edge of the dummy silicon pillar 103 (a part opposite to the silicon pillar 102 across the dummy silicon pillar 103). That is, the semiconductor device 100 is structured so that the dummy silicon pillar 103 allows the gate electrode 109 to extend horizontally. Upper portions of the through-hole conductors 121 to 123 are connected to an interconnect pattern (not shown) formed on the interlayer insulating film 120.

In the semiconductor device 100 structured as described above, a transistor channel is formed in an area put between the impurity diffusion layers 110 and 111 within the silicon pillar 102. The impurity diffusion layer 110 functions as one of a source and a drain whereas the impurity diffusion layer 111 functions as the other one of the source and the drain. An electric field applied to the gate electrode 109 via the through-hole conductor 121 controls a transistor to be turned on or off.

Meanwhile, as described above, heat treatment is performed just after formation of the gate electrode 109 so as to relax a shrinkage intrinsic stress generated at the time of forming the gate electrode 109. At this time, high compression thermal stresses are generated in the silicon pillars 102 and 103 and warping deformation tends to occur particularly to the silicon pillar 102. The thermal stresses and warping deformation are described below in detail.

Figure 2A:
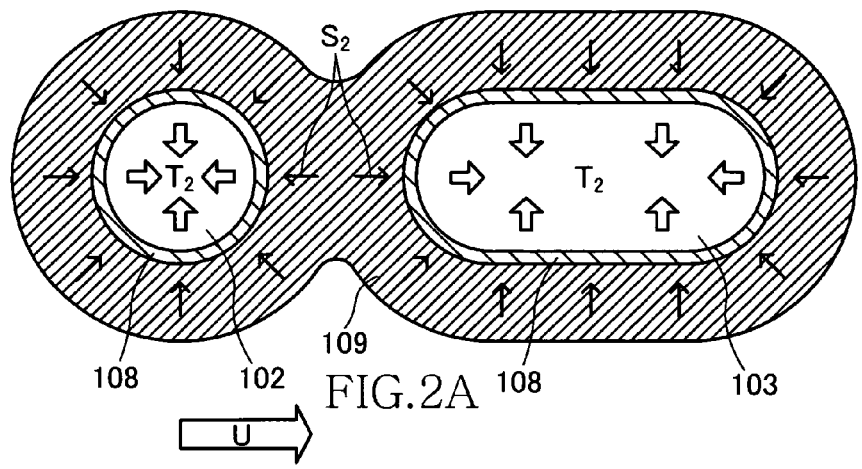
FIG. 2A corresponds to FIG. 1A and shows a structure of the semiconductor device according to the background technique of the present invention right after forming the gate electrode.
Figure 2B:
FIG. 2B corresponds to FIG. 1B and shows a structure of the semiconductor device according to the background technique of the present invention right after forming the gate electrode.
Figure 2B:
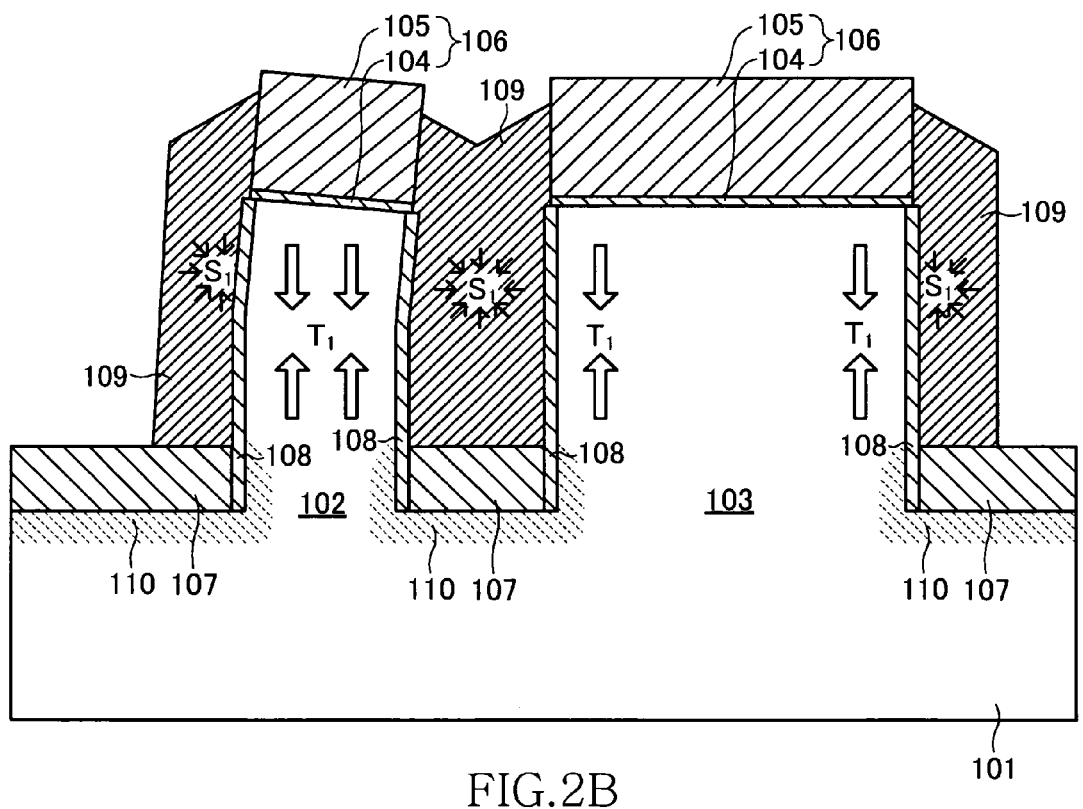

FIGS. 2A and 2B show a structure of the semiconductor device 100 right after forming the gate electrode 109. FIGS. 2A and 2B correspond to FIGS. 1A and 1B, respectively. The impurity diffusion layer 111, the interlayer insulating film 120 and the like are not formed yet because the structure shown is one right after forming the gate electrode 109.

At the time of heat treatment, thermal stresses $T_1$ and $T_2$ shown in FIGS. 2A and 2B are generated in respective interiors of the silicon pillars 102 and 103. The thermal stress $T_1$ is a compressive stress applied vertically and generated to follow shrinkage of a metal material constituting the gate electrode 109 in an arrow $S_1$ direction shown in FIG. 2B. The thermal stress $T_2$ is a compressive stress applied horizontally and generated to follow shrinkage of the metal material constituting the gate electrode 109 in an arrow $S_2$ direction shown in FIG. 2A.

In the semiconductor device 100, as is clear from FIG. 2A, the gate electrode 109 formed on the silicon pillar 102 and that formed on the silicon pillar 103 are structured to be asymmetrical with respect to central axes of the silicon pillars 102 and 103, respectively. Accordingly, the thermal stresses $T_1$ and $T_2$ generated in each of the silicon pillars 102 and 103 are non-uniform with respect to each of the central axes of the silicon pillars 102 and 103. As a result, warping deformation in an arrow U direction shown in FIG. 2A tends to occur to the silicon pillar 102, which is configured to be relatively thin.

The present invention has been achieved to suppress occurrence of such warping deformation as much as possible, and it is possible to realize suppression of warping deformation from occurring by making the thermal stresses $T_1$ and $T_2$ generated in each of the silicon pillars 102 and 103 as uniform as possible.

Preferred embodiments of the present invention will be explained below in detail with reference to the accompanying drawings.

Figure 3A:
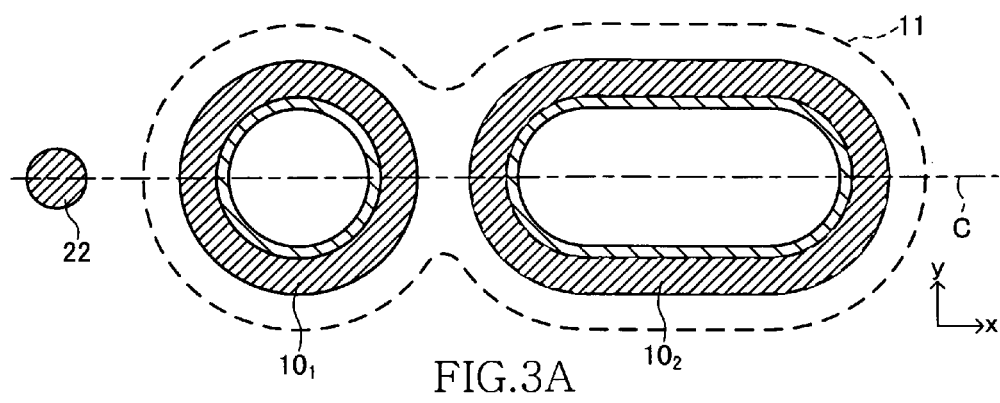
FIG. 3A is a schematic plan view which shows a structure of a semiconductor device according to the preferred embodiment of the present invention and shows a cross-section corresponding to a segment D shown in FIG. 3B.
Figure 3B:
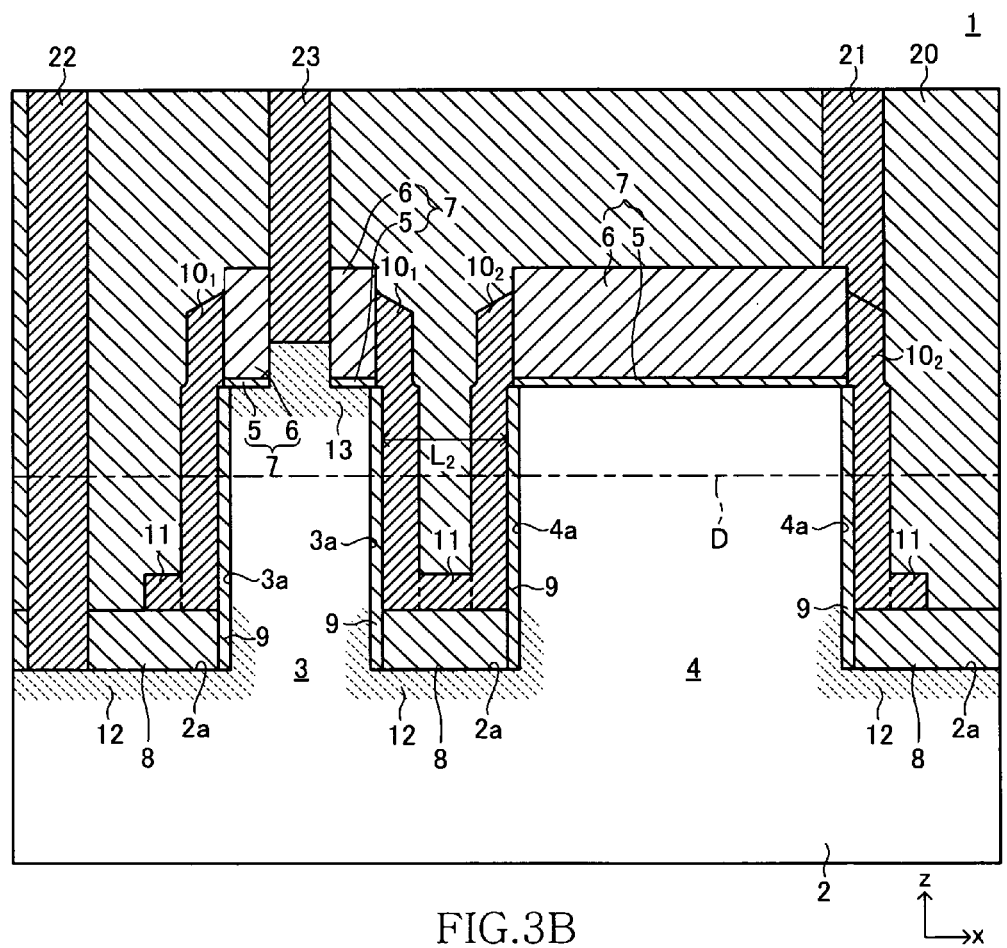
FIG. 3B is a schematic cross-sectional view which shows a structure of a semiconductor device according to the preferred embodiment of the present invention and shows a cross-section corresponding to a segment C shown in FIG. 3A.

FIGS. 3A and 3B show a structure of a semiconductor device 1 according to an embodiment of the present invention, where FIG. 3A is a schematic plan view and FIG. 3B is a schematic cross-sectional view showing a cross-section corresponding to a segment C shown in FIG. 3A. FIG. 3A shows a cross-section corresponding to a segment D shown in FIG. 3B. Note that FIG. 3A also shows a conductive film 11 that does not actually appear in the cross-section corresponding to the segment D for helping understand the structure of the semiconductor device 1. Furthermore, FIGS. 3A and 3B show an internal structure of an active area surrounded by STI (Shallow Trench Isolation), which is not shown in the drawings.

The semiconductor device 1 is used as a transistor for a peripheral circuit of a DRAM, for example. However, the present invention is not limited thereto, and can be also applied to a transistor in a memory cell of a DRAM or one in a circuit of anyone of various types such as memories of other types and logic circuits.

As shown in FIGS. 3A and 3B, the semiconductor device 1 according to the present embodiment includes two silicon pillars (first and second silicon pillars 3 and 4) formed by removing a part of a semiconductor (silicon) substrate 2. In the following descriptions, a direction in a horizontal plane connecting the first and second silicon pillars 3 is referred to as "x direction" and a direction in a horizontal plane perpendicular to the x direction is referred to as "y direction". Vertical direction is referred to as "z direction". Further, "bottom surface 2a of the substrate 2" refers to a surface of the substrate 2 in contact with lower surfaces of the first and second silicon pillars 3 and 4. The first and second silicon pillars 3 and 4 are provided to be built on the bottom surface 2a of the substrate 2.

The first silicon pillar 3 is a transistor pillar constituting a transistor channel. The second silicon pillar 4 is a dummy pillar for extending a gate electrode. The both of the first and second silicon pillars 3 and 4 are formed substantially perpendicularly to the bottom surface 2a of the substrate 2.

The first silicon pillar 3 is cylindrical and has a circular cross-section in an xy plane. On the other hand, the second silicon pillar 4 is columnar but does not have a circular cross-section in the xy plane but a corner-rounded rectangular cross-section. However, cross-sectional shapes of the first and second silicon pillars 3 and 4 in the xy plane are not limited to the circular and corner-rounded rectangular shapes, and can be square or rectangular shapes, for example. While lengths of the first silicon pillar 3 in y and z directions are equal to those of the second silicon pillar 4, a length of the second silicon pillar 4 in the x direction is larger than that of the first silicon pillar 3. The reason for making the x-direction length of the second silicon pillar 4 larger is to increase a formation margin of an interconnect layer (not shown) formed on an interlayer insulating film 20 (described later). Specific sizes of the first and second silicon pillars 3 and 4 can be set according to required transistor performances. By way of example, it is preferable that the lengths of the first silicon pillar 3 in the x, y, and z directions are about 70 nm, 70 nm, and 100 nm, respectively, and that the lengths of the second silicon pillar 4 in the x, y, and z directions are about 100, 70, and 100 nm, respectively.

A cap insulating film 7 configured to include a silicon oxide film 5 and a silicon nitride film 6 is formed on an upper surface of the second silicon pillar 4. This cap insulating film 7 is a remainder or a non-removed part of a mask pattern that is used for forming the first and second silicon pillars 3 and 4. Although a cap insulating film 7 also remains on an upper surface of the first silicon pillar 3, a central portion of the cap insulating film 7 is removed in a process of forming a second impurity diffusion layer 13 (described later).

A relatively thick silicon oxide film 8 having a thickness of about 30 nm is formed on the bottom surface 2a of the substrate 2. The silicon oxide film 8 is provided to isolate first and second gate electrodes $10_1$ and $10_2$ (described later), the conductive film 11 (described later), and the bottom surface 2a of the substrate 2 from one another.

A gate insulating film 9 having a thickness of about 5 nm is formed on each of aside surface 3a of the first silicon pillar 3 and a side surface 4a of the second silicon pillar 4. However, note that the gate insulating film 9 formed on the side surface 4a is a dummy insulating film, which functions as an insulating film but not as a gate insulating film. The gate insulating film 9 is formed by oxidizing an exposed surface of silicon in a state where the cap insulating film 7 and the silicon oxide film 8 are present. Therefore, the gate insulating film 9 is a silicon oxide film.

The first gate electrode $10_1$ is formed outside of the gate insulating film 9 formed on the side surface 3a. Similarly, the second gate electrode $10_2$ is formed outside of the gate insulating film 9 formed on the side surface 4a. The first and second gate electrodes $10_1$ and $10_2$ are both made of a metal material such as tungsten, titanium nitride or a stack of tungsten and titanium stacked one over another.

The first and second gate electrodes $10_1$ and $10_2$ are configured not to directly contact each other. Specifically, a sum of horizontal thicknesses of the first and second gate electrodes $10_1$ and $10_2$ is designed to be smaller than a minimum length $L_2$ between the first and second silicon pillars 3 and 4 (a minimum length between surfaces of the gate insulating films 9). The conductive film 11 formed along the bottom surface 2a of the substrate 2 realizes electrical connection between the first and second gate electrodes $10_1$ and $10_2$. As can be understood from FIGS. 3A and 3B, the conductive film 11 is arranged so as to cover lower portions of the first and second gate electrodes $10_1$ and $10_2$ with the conductive film 11, and electrically connects the lower portions of the first and second gate electrodes $10_1$ and $10_2$ to each other. The conductive film 11 is the remainder of a part of a metal material deposited on the bottom surface 2a of the substrate 2 at the time of forming the first and second gate electrodes $10_1$ and $10_2$, and made of a same material (a metal material) as that of the first and second gate electrodes $10_1$ and $10_2$.

In this way, the first and second gate electrodes $10_1$ and $10_2$ are configured not to directly contact each other. Therefore, the first and second gate electrodes $10_1$ and $10_2$ formed on the side surfaces 3a and 4a of the first and second silicon pillars 3 and 4 are symmetrical in structure with respect to central axes of the corresponding silicon pillars 3 and 4, respectively. Therefore, in the semiconductor device 1, it is possible to make uniform the thermal stresses $T_1$ and $T_2$ (see FIGS. 2A and 2B) generated in the first silicon pillar 3 at the time of the heat treatment right after film formation, thereby suppressing warping deformation as shown in FIG. 2B from occurring to the first silicon pillar 3. Similarly, it is possible to make uniform the thermal stresses $T_1$ and $T_2$ generated in the second silicon pillar 4, thereby suppressing warping deformation from occurring to the second silicon pillar 4.

A first impurity diffusion layer 12 is formed inside of the bottom surface 2a of the substrate 2. Note that the first impurity diffusion layer 12 is located not in a region right under the first and second silicon pillars 3 and 4 but in a flat region of the substrate 2 where no silicon pillars are formed. Furthermore, a second impurity diffusion layer 13 is provided on an upper end of the first silicon pillar 3. The first and second impurity diffusion layers 12 and 13 are formed by implanting ions of impurity having an opposite conductivity type to that of impurity contained in the substrate 2 on the bottom surface 2a of the substrate 2 and the upper end of the first silicon pillar 3, respectively.

The semiconductor device 1 further includes the interlayer insulating film 20 constituted by a silicon oxide film with which the respective constituent elements described above are covered. The thickness of the interlayer insulating film 20 is set to exceed heights of the second impurity diffusion layer 13 and the cap insulating film 7.

First to third through-hole conductors 21 to 23 are formed in the interlayer insulating film 20. The first through-hole conductor 21 constitutes a gate contact plug and has a lower end in contact with a part of the upper surface of the second gate electrode $10_2$, which part is located on a periphery of the second silicon pillar 4 (a part opposite to the first silicon pillar 3 across the second silicon pillar 2). The second through-hole conductor 22 constitutes a diffusion-layer contact plug and has a lower end penetrating through the silicon oxide film 8 and in contacts with an upper surface of the first impurity diffusion layer 12. Similarly to the second through-hole conductor 22, the third through-hole conductor 23 constitutes a diffusion-layer contact plug and has a lower end penetrating through the cap insulating film 7 and in contact with an upper surface of the second impurity diffusion layer 13. Upper portions of the first to third through-hole conductors 21 to 23 are connected to the interconnect pattern (not shown) formed on the interlayer insulating film 20.

In the semiconductor device 1 structured as described above, the transistor channel is formed in a region put between the first and second impurity diffusion layers 12 and 13 within the first silicon 3. The first impurity diffusion layer 12 functions as one of a source and a drain and the second impurity diffusion layer 13 functions as the other one of the source and the drain.

The first gate electrode $10_1$ is conductive to the first through-hole conductor 21 via the conductive film 11 and the second gate electrode $10_2$. Accordingly, in the semiconductor device 1 similarly to the semiconductor device 100 according to the background technique, an electric field applied to the first through-hole conductor 21 can control a transistor to be turned on or off.

As described above, in the semiconductor device 1, the first and second gate electrodes $10_1$ and $10_2$ do not directly contact with each other. Therefore, it is possible to make uniform the high compression thermal stresses generated in each of the first and second silicon pillars 3 and 4 at the time of the heat treatment right after forming the first and second gate electrodes $10_1$ and $10_2$ because the first and second gate electrodes $10_1$ and $10_2$ are made of a metal material, and to suppress warping deformation from occurring to each of the first and second silicon pillars 3 and 4. Further, the semiconductor device 1 includes the conductive film 11. Therefore, it is possible to control the channel formed in the first silicon pillar 3 via the gate contact plug (the first through-hole conductor 21) in contact only with the second gate electrode $10_2$ despite no direct contact between the first and second gate electrodes $10_1$ and $10_2$.

A method of manufacturing the semiconductor device 1 according to the present embodiment is explained next.

FIGS. 4 to 12 are process views for explaining the method of manufacturing the semiconductor device 1 according to the present embodiment. FIGS. 4A, 5A, . . . and 12A are schematic plan views corresponding to FIG. 3A, and FIGS. 4B, 5B, . . . and 12B are schematic cross-sectional views corresponding to FIG. 3B.

To manufacture the semiconductor device 1, the silicon substrate 2 is prepared first and the first and second silicon pillars 3 and 4 are formed on the surface of the substrate 2. To form the first and second silicon pillars 3 and 4, the cap insulating film 7 constituted by stacking the silicon oxide film 5 serving as a protection insulating film and the silicon nitride film 6 serving as a hard mask one over another is formed first on the entire surface of the substrate 2. Although not particularly limited, the silicon oxide film 5 and the silicon nitride film 6 can be formed by the CVD method. Preferably, the thickness of the silicon oxide film 5 is about 5 nm and that of the silicon nitride film 6 is about 120 nm.

Figure 4A:
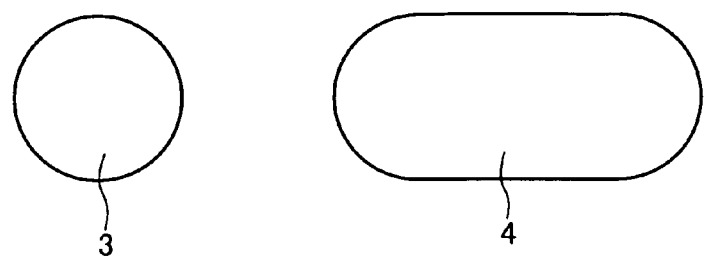
FIGS. 4A, 5A, ... and 12A are process views for explaining the method of manufacturing the semiconductor device according to the present embodiment and schematic plan views corresponding to FIG. 3A.
Figure 4B:
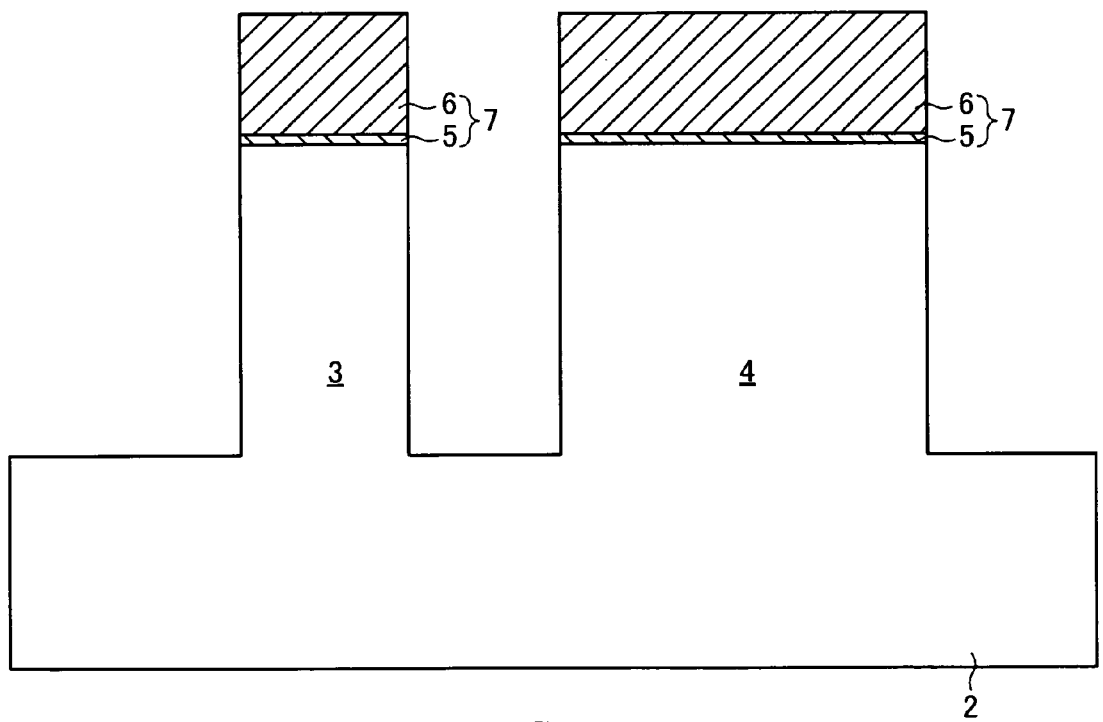
FIGS. 4B, 5B, ... and 12B are process views for explaining the method of manufacturing the semiconductor device according to the present embodiment and schematic cross-sectional views corresponding to FIG. 3B.

Thereafter, the cap insulating film 7 is patterned, thereby removing all parts of the cap insulating film 7 except for parts present in regions where the first and second silicon pillars 3 and 4 are to be formed as shown in FIG. 4B. After forming the cap insulating film 7, the surface of the substrate 2 is etched by dry etching with the cap insulating film 7 used as a mask. As a result of this etching step, concave portions are formed on an exposed surface of the active area and the parts that are not etched become the first and second silicon pillars 3 and 4, respectively as shown in FIGS. 4A and 4B.

Figure 5A:
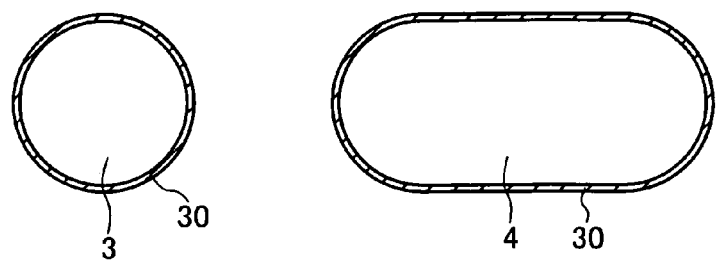
Figure 5B:
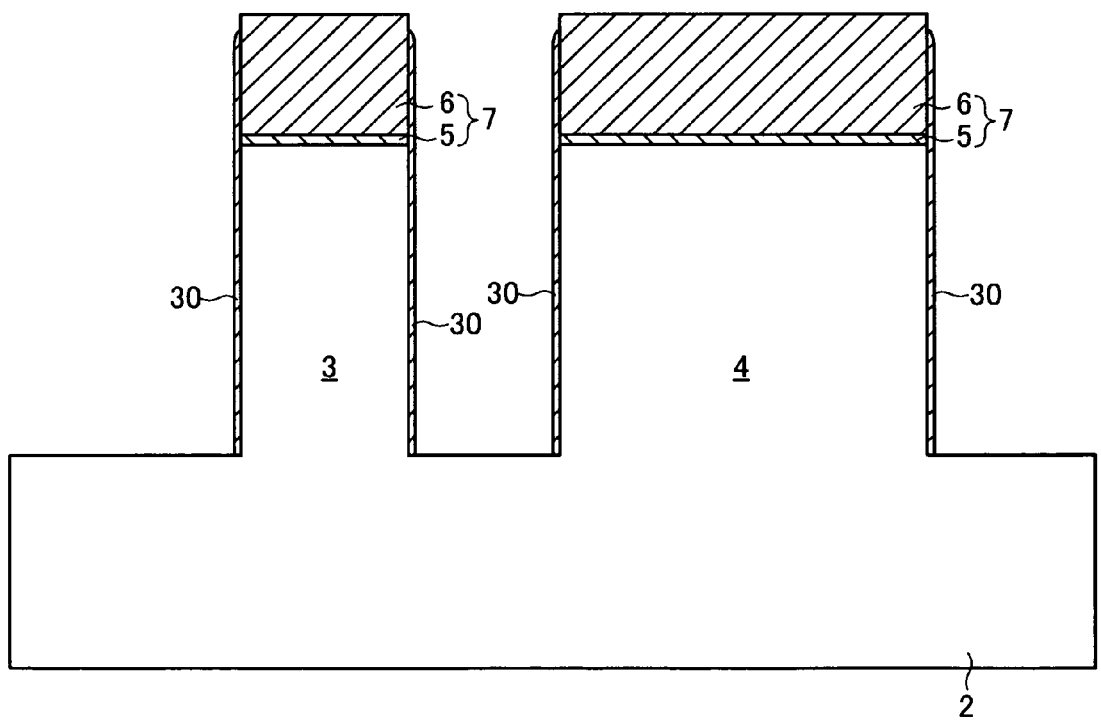

Next, as shown in FIGS. 5A and 5B, a sidewall insulating film 30 is formed on each of the side surface 3a of the first silicon pillar 3 and the side surface 4a of the second silicon pillar 4. The sidewall insulating film 30 is formed by forming a silicon nitride film and performing anisotropic etching-back on this silicon nitride film after protecting the exposed surface of the active area by thermal oxidation while leaving the cap insulating film 7. As a result, the side surfaces 3a and 4a are covered with the sidewall insulating film 30.

Figure 6A:
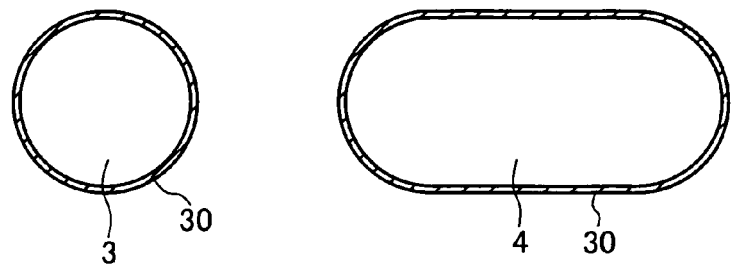
Figure 6B:
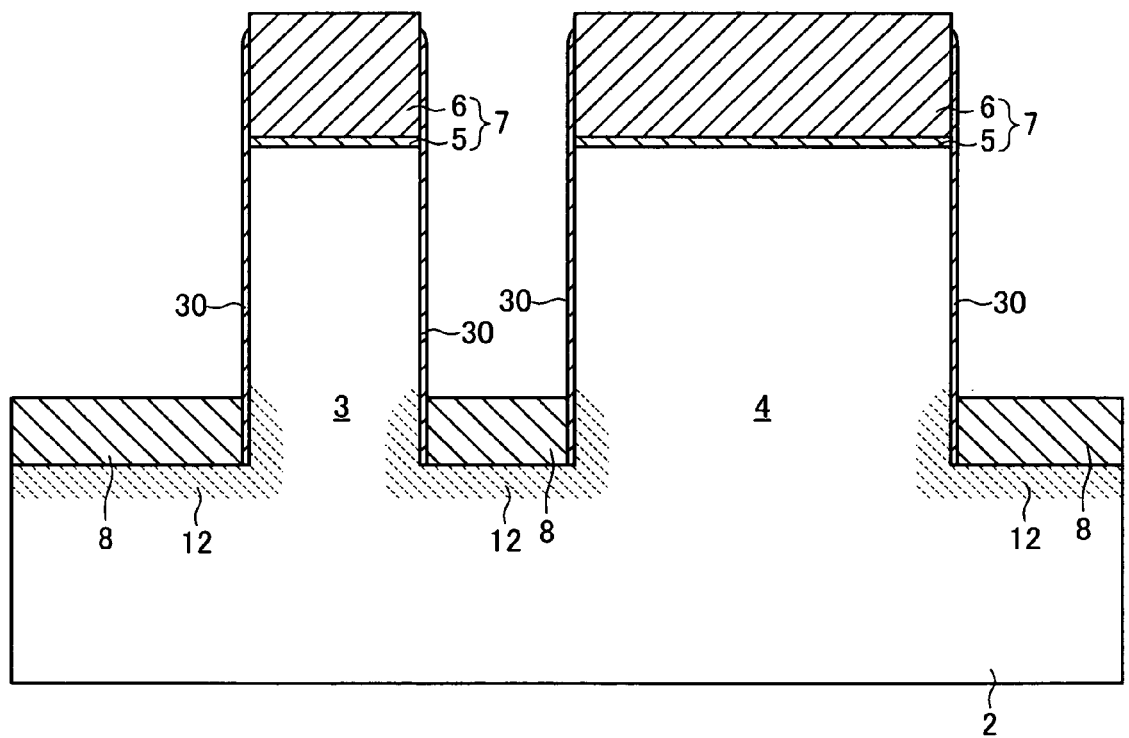

A silicon oxide film is deposited by HDP (High Density Plasma) and subjected to etching-back, thereby forming the silicon oxide film 8 on the exposed surface of the substrate 2 (that is, the bottom surface 2a of the substrate 2) as shown in FIG. 6B. Alternatively, the silicon oxide film 8 can be formed by thermal oxidation. The thickness of the silicon oxide film 8 is set enough to insulate the first and second gate electrodes $10_1$ and $10_2$, the conductive film 11, and the bottom surface 2a of the substrate 2 from one another. Specifically, it suffices that the thickness of the silicon oxide film 8 is about 30 nm.

After forming the silicon oxide film 8, ions of impurity having the opposite conductivity type to that of the impurity contained in the substrate 2 are implanted on the bottom surface 2a of the substrate 2, thereby forming the first impurity diffusion layer 12 inside the bottom surface 2a of the substrate 2.

Figure 7A:
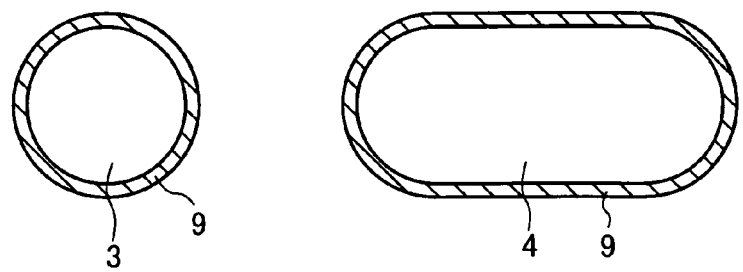
Figure 7B:
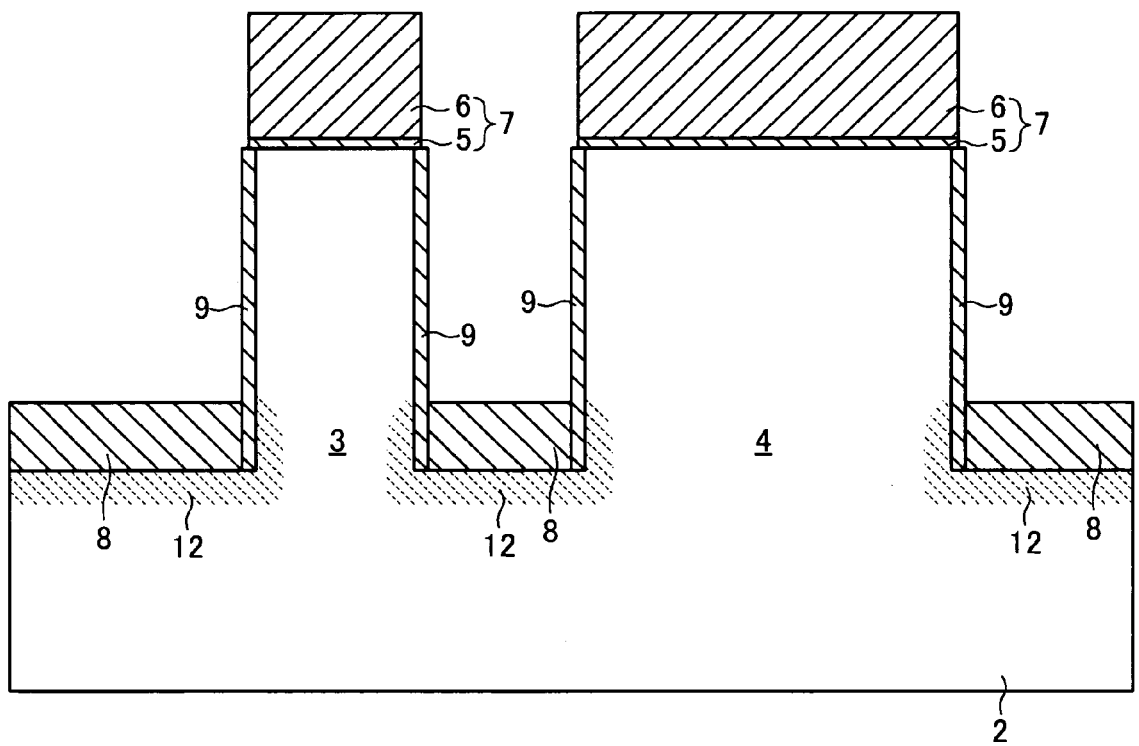

After removing the sidewall insulating film 30 using hot phosphoric acid, each of the exposed side surfaces 3a and 4a is subjected to thermal oxidation, thereby forming the gate insulating film 9 as shown in FIGS. 7A and 7B. The thickness of the gate insulating film 9 is preferably about 5 nm. After forming the gate insulating film 9, it is preferable that the side surfaces 3a and 4a are cleaned.

Figure 8A:
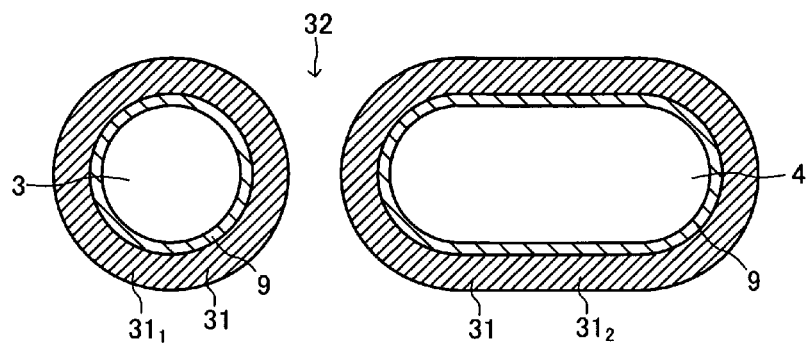
Figure 8B:
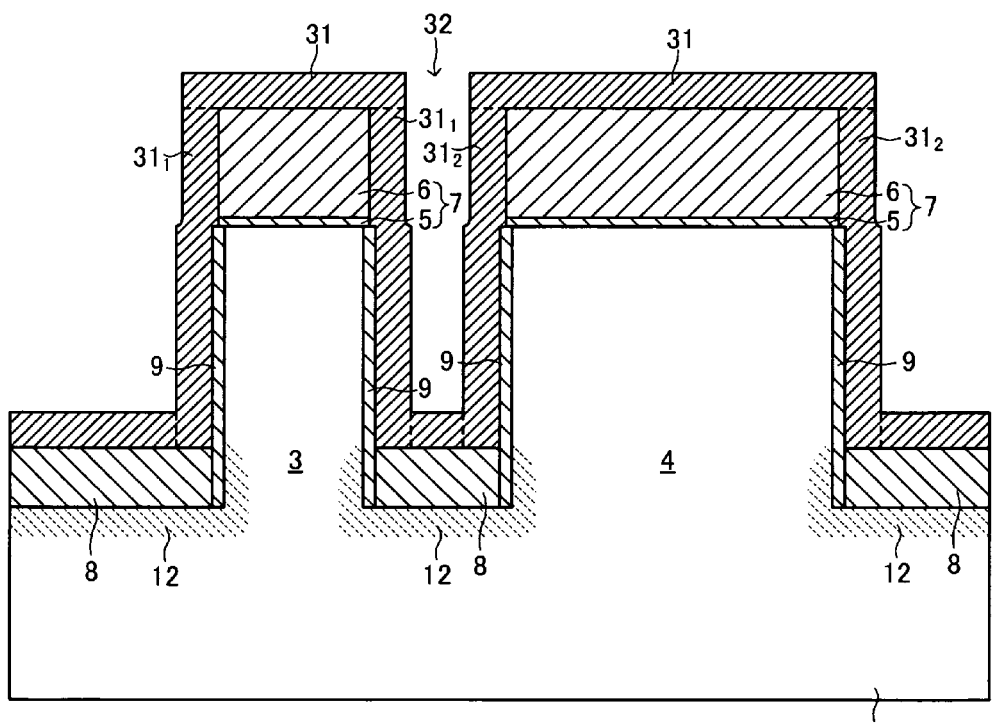

Next, as shown in FIGS. 8A and 8B, a film made of a gate electrode material 31 with which the gate insulating film 9 is covered is formed by the CVD method. As the gate electrode material 31, a metal material is used so as to suppress the influence of depletion of gate electrodes. Specifically, a single material such as tungsten or titanium nitride can be used or a stack of these single materials can be used as the gate electrode material 31. A film formation amount of the gate electrode material 31 is set so that a first part $31_1$ with which the side surface 3a is covered does not directly contact with a second part $31_2$ with which the side surface 4a is covered. Specifically, it suffices to control the film formation amount of the gate electrode material 31 so that a horizontal thickness of the gate electrode material 31 after film formation is 20 nm when the minimum length $L_2$ between the first and second silicon pillars 3 and 4 (minimum length between the surfaces of the gate insulating film 9 formed on the side surfaces 3a and 4a of the first and second silicon pillars 3 and 4, respectively). By controlling the film formation amount of the gate electrode material 31 in this manner, a void 32 is formed between the first and second silicon pillars 3 and 4.

Figure 9A:
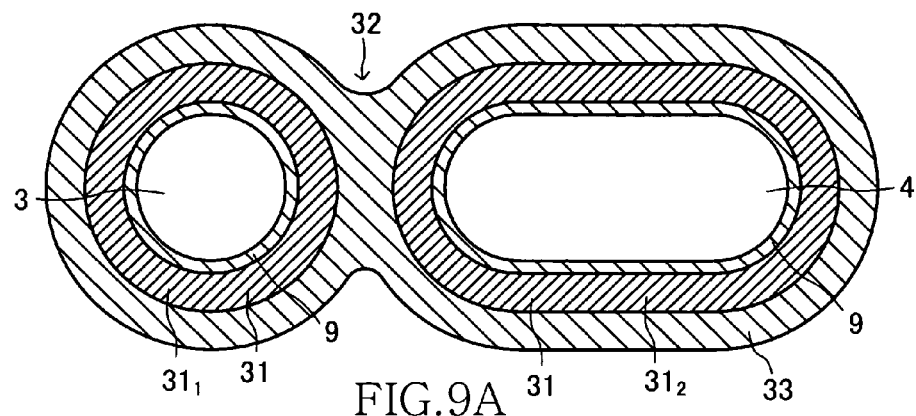
Figure 9B:
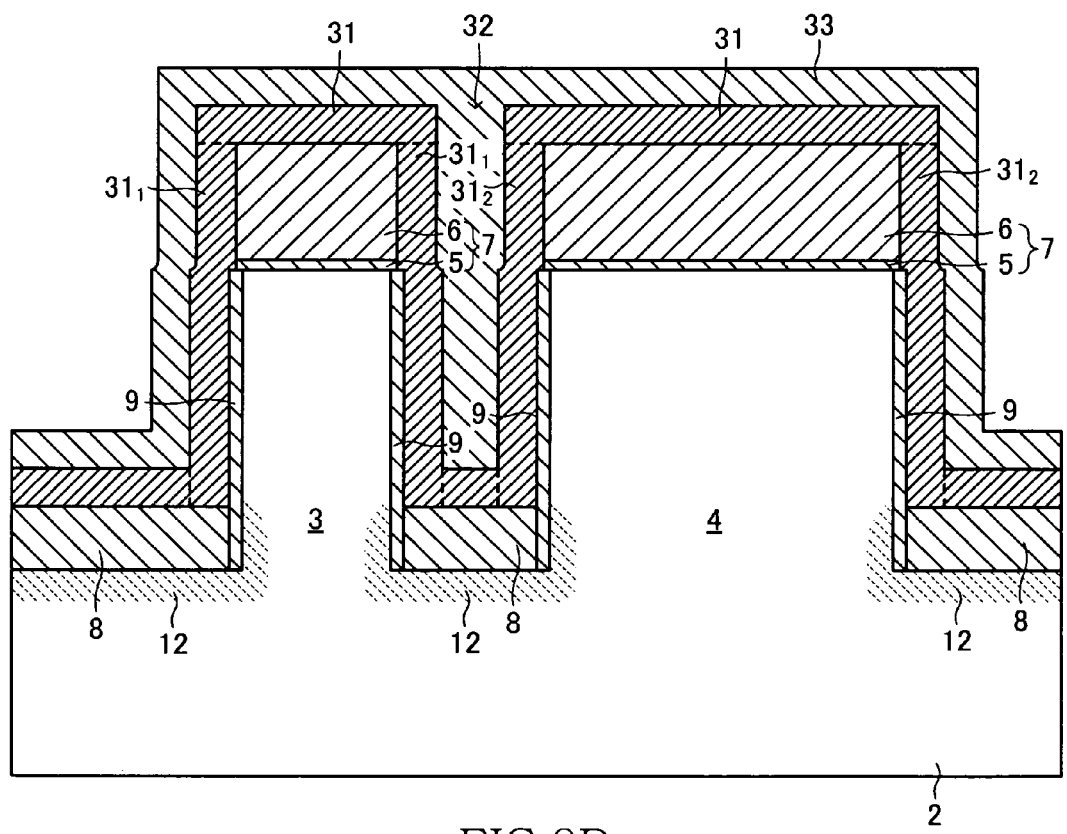
Figure 10A:
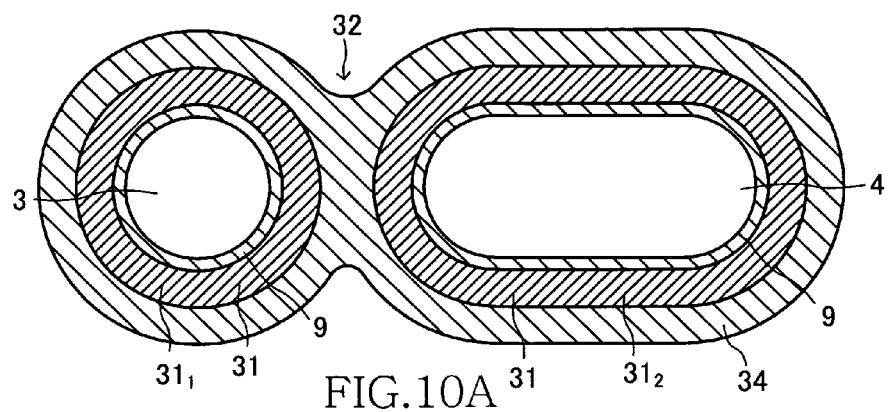
Figure 10B:
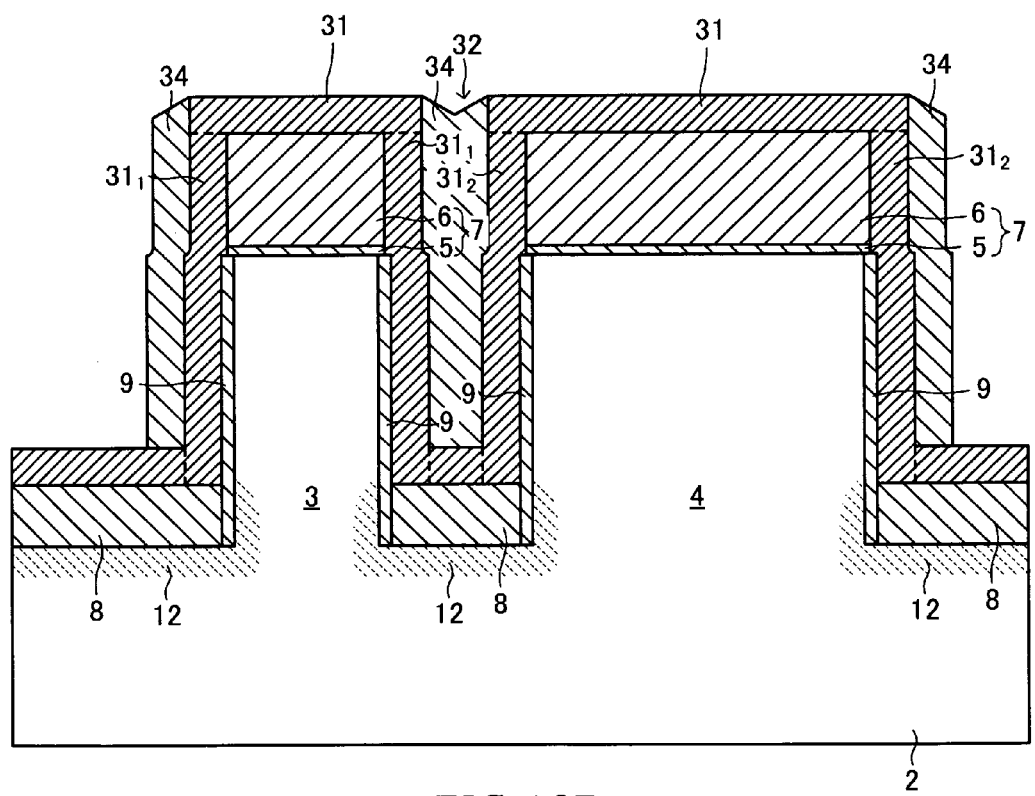

Next, as shown in FIGS. 9A and 9B, an insulating film 33 having a thickness (about 30 nm or more) enough to fill the void 32 with the insulating film 33 is formed by the CVD method. It is preferable to form a silicon oxide film as this insulating film 33. The formed insulating film 33 is subjected to anisotropic etching-back. Out of all parts of the insulating film 33, only parts of the insulating film 33 in parallel to the surface 2a of the substrate 2 are removed. As shown in FIGS. 10A and 10B, a mask insulating film 34 covering the side surfaces 3a and 4a from above the gate electrode material 31 and filling the void 32 is formed.

Figure 11A:
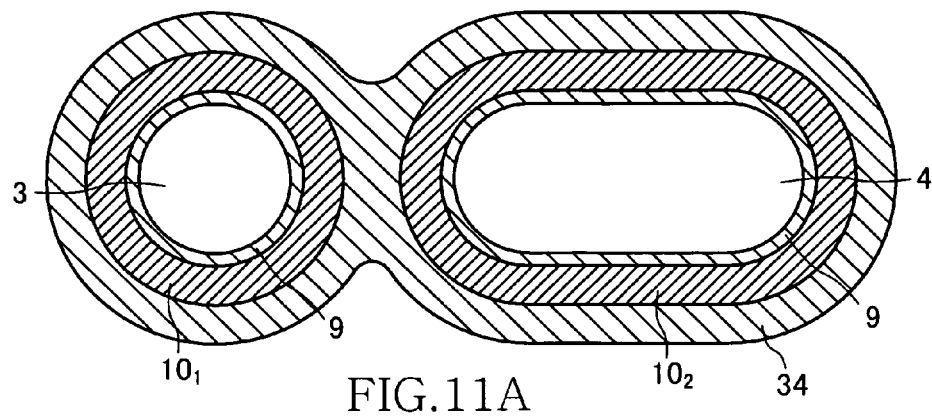
Figure 11B:
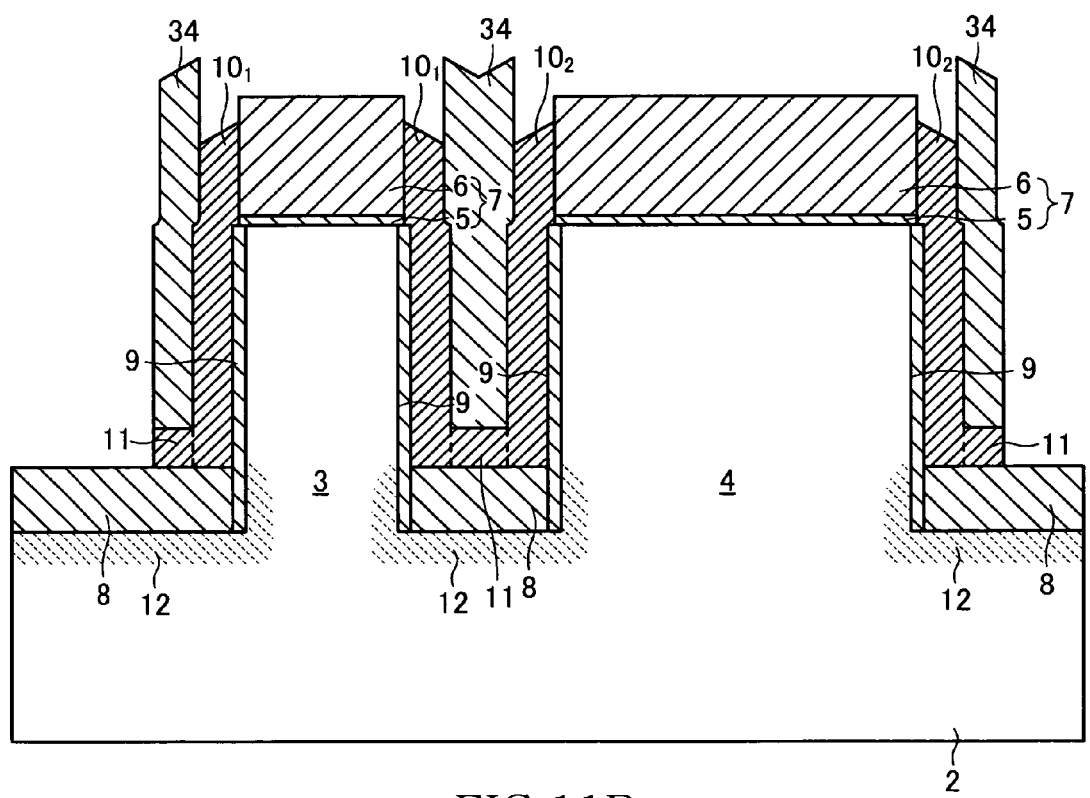

As shown in FIGS. 11A and 11B, the gate electrode material 31 is etched with the mask insulating film 34 used as a mask. By the steps up to this point, the first and second gate electrodes $10_1$ and $10_2$ that are not physically connected but electrically connected to each other by the thin conductive film 11 left on the bottom surface 2a of the substrate 2 are formed. As shown in FIGS. 12A and 12B, after the mask insulating film 34 is removed, heat treatment is performed on the entire semiconductor device 1 so as to relax the shrinkage intrinsic stress. The heat treatment is preferably performed under conditions of a nitride atmosphere, 1000° C., and 10 seconds. Although the heat treatment generates the high thermal stresses in the first and second silicon pillars 3 and 4 as described above, warping deformation is less likely to occur at the time of the heat treatment because these thermal stresses are made uniform in the semiconductor device 1.

After finishing the heat treatment, a silicon oxide film is deposited on the entire surface of the substrate 2 and made planar by CMP (Chemical Mechanical Polishing), thereby forming an interlayer insulating film approximately as high as the cap insulating film 7. A part of the cap insulating film 7 formed on the upper surface of the first silicon pillar 3 is removed by photolithography using a resist, thereby exposing the upper surface of the first silicon pillar 3. Silicon is grown on the exposed upper surface of the first silicon pillar 3 by selective epitaxial growth and impurity ions are implanted on the silicon, thereby forming the second impurity diffusion layer 13 shown in FIG. 3. Thereafter, a silicon oxide film is further deposited on the entire surface of the substrate 2 and made planar by the CMP, thereby forming the interlayer insulating film 20. Furthermore, through-holes for forming the first to third through-hole conductors 21 to 23 are formed. By filling the through-holes thus formed with the stack of titanium nitride and tungsten, the first to third through-hole conductors 21 to 23 are formed. Thus, the semiconductor device 1 shown in FIG. 3 is completed.

It is apparent that the present invention is not limited to the above embodiments, but may be modified and changed without departing from the scope and spirit of the invention.

For example, the above embodiment has been explained on the assumption that the gate electrode material is a metal material. However, the present invention is also applicable to a case where the gate electrode material is a nonmetal material such as DOPOS (Doped polycrystalline silicon). The compression thermal stresses generated in the silicon pillars when the gate electrodes made of a nonmetal material are used are lower than those when the gate electrodes made of a metal material are used, but not reduced to zero, and the possibility of occurrence of warping deformation is not zero, either. In either case, according to the present invention, it is possible to suppress occurrence of such warping deformation.

What is claimed is:

1. A method comprising:
    forming first and second pillars over a semiconductor substrate, the first and second pillars being adjacent to each other with a space therebetween, the first pillar including a semiconductor body and a gate insulating film covering a side surface of the semiconductor body;
    depositing a conductive layer over the first and second pillars and the semiconductor substrate without completely filling the space so that a gap, that is free from being filled with the conductive layer, remains between the first and second pillars;
    depositing an insulating layer over the conductive layer by completely filling the gap;
    etching back the insulating layer until a top surface of the conductive layer is exposed so that an insulating side wall is formed to surround each of the first and second pillars and substantially complete filling of the gap with an intervention of a part of the conductive layer;
    selectively removing the conductive layer by using the insulating side wall as a mask to form a gate electrode, the gate electrode including a first cylindrical portion that surrounds the first pillar, a second cylindrical portion that surrounds the second pillar, a first horizontal portion that is in the space to connect respective parts of the first and second cylindrical portions to each other, and a second horizontal portion that spreads over the semiconductor substrate from remaining parts of the first and second cylindrical portions;
    depositing an interlayer insulating film over the gate electrode that includes the first and second cylindrical portions and the first and second horizontal portions; and
    selectively forming, in the interlayer insulating film, first and second conductors that are connected to the gate electrode and the semiconductor body of the first pillar, respectively.

2. The method as claimed in claim 1, further comprising removing the insulating side wall prior to depositing the interlayer insulating film.

3. The method as claimed in claim 1, further comprising depositing an under insulating film prior to depositing the conductive layer, wherein the under insulating film is greater in thickness than the gate insulating film.

4. The method as claimed in claim 1, wherein the first and second pillars are arranged in line in a first direction, and
    wherein at least one of the first and second pillars has a corner-rounded rectangular shape in a plan view and a major axis of the corner-rounded rectangular shape is in the first direction.

5. The method as claimed in claim 1, wherein the conductive layer comprises a metal.

6. The method as claimed in claim 5, wherein the conductive layer comprises a plurality of metal layers stacked with each other.

7. The method as claimed in claim 6, wherein the conductive layer has a shrinkage intrinsic stress.

8. The method as claimed in claim 1, wherein the insulating layer has enough of a thickness to fill the gap.

9. The method as claimed in claim 1,
wherein the first pillar includes a first impurity diffusion layer of a first conductivity type at a top portion defined by a top surface of the semiconductor body of the first pillar,
wherein a channel region in the middle of the semiconductor body of the first pillar is of a second conductivity type, and
wherein the semiconductor substrate includes a second impurity diffusion layer of the first conductivity type formed to cooperate with the first diffusion region to sandwich the channel region.

10. The method as claimed in claim 9, wherein the second conductor is connected to the semiconductor body of the first pillar so that the second conductor is electrically connected with the first impurity diffusion layer.

11. A method of manufacturing a semiconductor device comprising:
forming first and second semiconductor pillars projecting from a semiconductor body adjacent to each other, the semiconductor pillars thereby including upper surfaces and side surfaces, respectively;
forming a gate insulating film on a main surface of the semiconductor body and each of the side surfaces of the first and second semiconductor pillars;
forming a first insulating film being thicker than the gate insulating film on the main surface of the semiconductor body between the first and second semiconductor pillars;
forming a gate electrode covering the gate insulating film and the first insulating film, parts of the gate electrode formed on the side surfaces of the first and second semiconductor pillars having a first film thickness in a lateral direction;
forming a second insulating film to cover the gate electrode, a part of the second insulating film formed between the first and second semiconductor pillars having a second film thickness in a lateral direction;
etching the second insulating film to be exposed the gate electrode;
etching the gate electrode downwardly using the second insulating film as a mask whereby a first gate electrode is formed on the side surface of the first semiconductor pillar via the gate insulating film, a second gate electrode is formed on the side surface of the second semiconductor pillar via the gate insulating film, and a connecting gate electrode is formed on the first insulating film located between the first and second semiconductor pillars, the connecting gate electrode connecting the first and second gate electrodes electrically, a first distance that is a shortest distance between a surface of the gate insulating film formed on the first semiconductor pillar and a surface of the gate insulating film formed on the second semiconductor pillar being shorter than a total of the twice of the first film thickness and the second film thickness;
forming a third insulating film to cover the first and second gate electrodes and the connecting gate electrode after removing the second insulating film;
forming a first contact plug electrically connecting to the upper surface of the first semiconductor pillar;
forming a second contact plug electrically connecting to the gate electrode of the second semiconductor pillar.

\* \* \* \* \*